United States Patent [19]

Ernst

[11] 4,403,859
[45] Sep. 13, 1983

[54] PHOTOELECTRIC INCREMENTAL MEASURING APPARATUS

[75] Inventor: Alfons Ernst, Traunreut, Fed. Rep. of Germany

[73] Assignee: Johannes Heidenhain GmbH, Traunreut, Fed. Rep. of Germany

[21] Appl. No.: 215,410

[22] Filed: Dec. 11, 1980

[30] Foreign Application Priority Data

Dec. 22, 1979 [DE] Fed. Rep. of Germany ....... 2952106

[51] Int. Cl.³ .......................................... G01D 5/245
[52] U.S. Cl. .................. 356/374; 33/125 C; 250/237 G
[58] Field of Search ....................... 356/373, 374, 375; 250/237 G, 231 SE; 33/125 C; 340/507, 508

[56] References Cited

U.S. PATENT DOCUMENTS

| | | | |
|---|---|---|---|
| 2,220,427 | 11/1940 | Romanus | 340/508 |
| 3,534,360 | 10/1970 | Hafle | 250/231 SE |
| 3,544,800 | 12/1970 | Elliott | 250/237 G |
| 3,671,755 | 6/1972 | Hovius | 250/237 G |
| 3,966,331 | 6/1976 | Inuiya | 356/375 |
| 3,985,448 | 10/1976 | Wiklund et al. | 250/237 G |
| 4,078,173 | 3/1978 | Fultz | 356/375 |
| 4,171,160 | 10/1979 | Ernst | 356/375 |
| 4,229,646 | 10/1980 | Burkhardt et al. | 250/237 G |

FOREIGN PATENT DOCUMENTS

| | | |
|---|---|---|
| 876162 | 5/1953 | Fed. Rep. of Germany . |
| 1814785 | 6/1970 | Fed. Rep. of Germany . |
| 2540412 | 8/1979 | Fed. Rep. of Germany . |
| 52-28347 | 3/1977 | Japan ................. 356/375 |
| 1527414 | 11/1975 | United Kingdom . |

Primary Examiner—R. A. Rosenberger
Attorney, Agent, or Firm—Hume, Clement, Brinks, Willian & Olds, Ltd.

[57] ABSTRACT

An improved photoelectric incremental measuring apparatus for measuring the relative displacement of two objects is disclosed, the apparatus including a measuring scale and a scanning unit for scanning the scale having a reticle, the scale and reticle each carrying a measuring grid. The scale has at least two nonidentical reference marks, each of which comprises a line group with an irregular line spacing pattern. The reticle has at least two reading fields, each of which comprises a line group with an irregular line spacing pattern that is identical to the line spacing pattern of a selected one of the reference marks. The reading fields occupy such positions on the reticle that each reading field aligns with its corresponding reference mark simultaneously as the scanning unit moves along the scale. Each reading position on the scanning unit is illuminated by a light source, such as a lamp, and the light sources are connected across a common resistor, mounted in series, to a power source.

19 Claims, 7 Drawing Figures

FIG. 1
FIG. 2
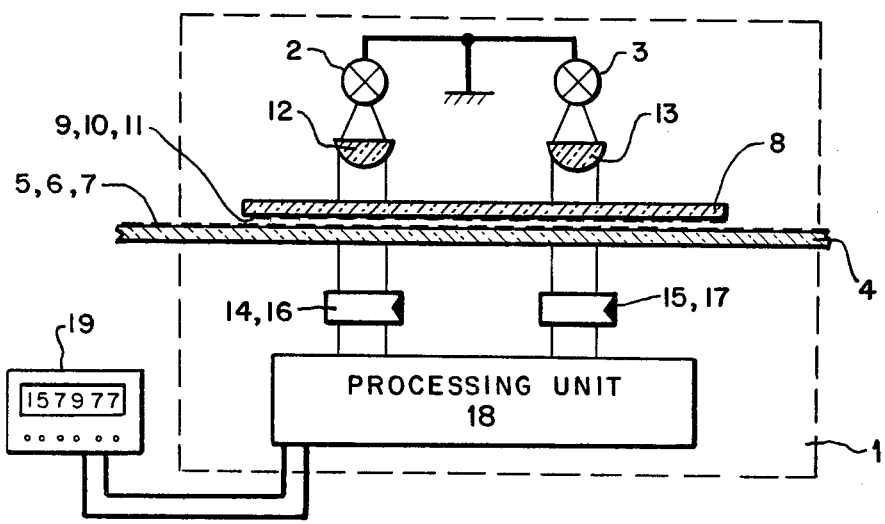
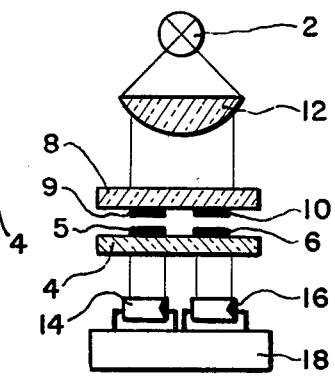
FIG. 3
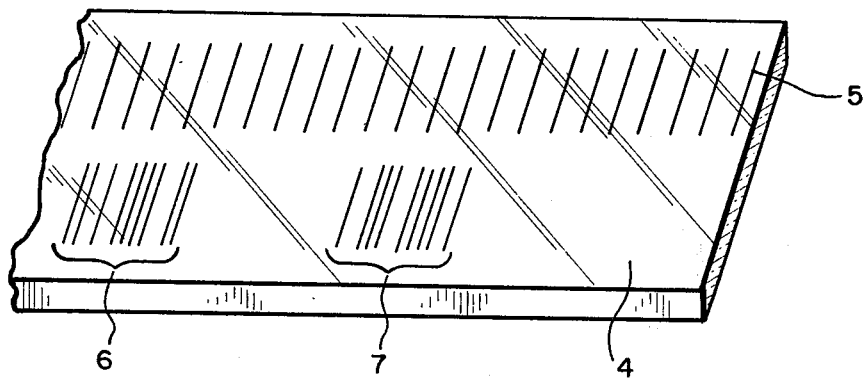
FIG. 4
FIG. 7
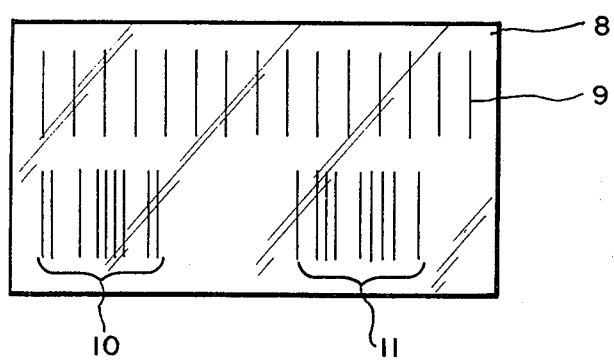
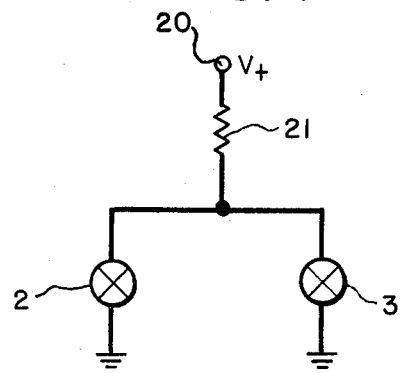

PHOTOELECTRIC INCREMENTAL MEASURING APPARATUS

CROSS-REFERENCE TO RELATED APPLICATIONS

This application is the U.S. counterpart of West German Application No. P 29 52 106.0, dated Dec. 22, 1979, whose priority date is hereby claimed.

BACKGROUND OF THE INVENTION

This invention relates to photoelectric incremental measuring apparatus for measuring the relative displacement of two objects, in particular to such incremental measuring apparatus as utilize position reference marks.

Various types of measuring apparatus are known in the art. For example, West German No. OS 18 14 785 discloses a photoelectric length-measuring apparatus which utilizes a position reference mark in addition to the measuring grid. It describes the operation of the apparatus and of the reference mark, and in FIG. 2 shows the structure of the reference mark.

It is also a known practice to provide a series of reference marks along the measuring grid of an incremental measuring system. From this series of like reference marks, individual marks can be selected for use by suitable means, as disclosed in West German No. AS 25 40 412.

Furthermore West German No. PS 876,162 discloses that particularly favorable results can be obtained if the lines of a group of lines that make up a reference mark are arranged at unequal distances from each other. In such a marking scheme the lines of the line groups on the reticle have the same spacing arrangement as the lines of the line groups on the scale. A signal with an improved signal-to-noise ratio is then obtained whenever the lines of the line groups on the reticle and scale come to overlap each other exactly.

The references discussed above identify a shortcoming of incremental measuring systems: after an interruption in operation, it is not directly possible to recover the initial position of the measuring system. Two of the references, Nos. OS 18 14 785 and AS 25 40 412, however describe how the initial position can be recovered.

The known measuring arrangements also have a disadvantage in that a partial failure of illumination in the system disrupts measurements and can lead to considerable interruptions in operation, with long down times.

SUMMARY OF THE INVENTION

The present invention is directed to an improved photoelectric incremental measuring system which is less subject to the disadvantages discussed above. In particular, it is an object of the present invention to provide an incremental measuring apparatus in which a partial failure in the illumination system will not perceptibly disturb measurements.

It is another object of the present invention to provide an incremental measuring apparatus which is more accurate than some prior art devices.

According to this invention, a photoelectric incremental measuring apparatus for measuring the relative displacement of two objects is provided in which the apparatus includes a measuring scale and a scanning unit having a reticle for scanning the scale. The scale and reticle each bear a measuring grid. In addition, at least two nonidentical reference marks are provided on the scale and at least two reading fields are provided on the reticle. Each of the reading fields is identical with a selected one of the reference marks. The reading fields are positioned on the reticle so that they come into alignment with their corresponding reference marks simultaneously as the scanning unit moves along the scale.

Preferably, each reference mark and each reading field is comprised of a line group which has an irregular line spacing pattern, and the nonidentical reference marks and their corresponding reading fields are obtained by varying the line spacing pattern from reference mark to reference mark.

In a preferred embodiment of this invention, at least two lights sources, most preferably lamps are provided, and each light source is arranged to illuminate a separate reading position on the scanning unit. Preferably, each of the light sources is connected across a voltage regulating means, most preferably a common resistor mounted in series, with a power source.

The invention itself, together with further objects and attendant advantages, will be best understood by reference to the following detailed description taken in connection with the accompanying drawings.

BRIEF DESCRIPTION OF THE DRAWINGS

FIG. 1 is a schematic front view of a photoelectric measuring apparatus including a first embodiment of the present invention.

FIG. 2 is a schematic side view of the photoelectric measuring apparatus of FIG. 1;

FIG. 3 is a perspective view of the scale of FIGS. 1 and 2 showing the scale measuring grid and the reference marks;

FIG. 4 is a plan view of the reticle of FIG. 1 showing the reticle measuring grid and the reading fields;

FIG. 7 is a diagram of a circuit for simultaneous operation of two illuminating lamps utilized in the photoelectric system of the first preferred embodiment of FIGS. 1 and 2.

DETAILED DESCRIPTION OF PREFERRED EMBODIMENTS

Figure 5:
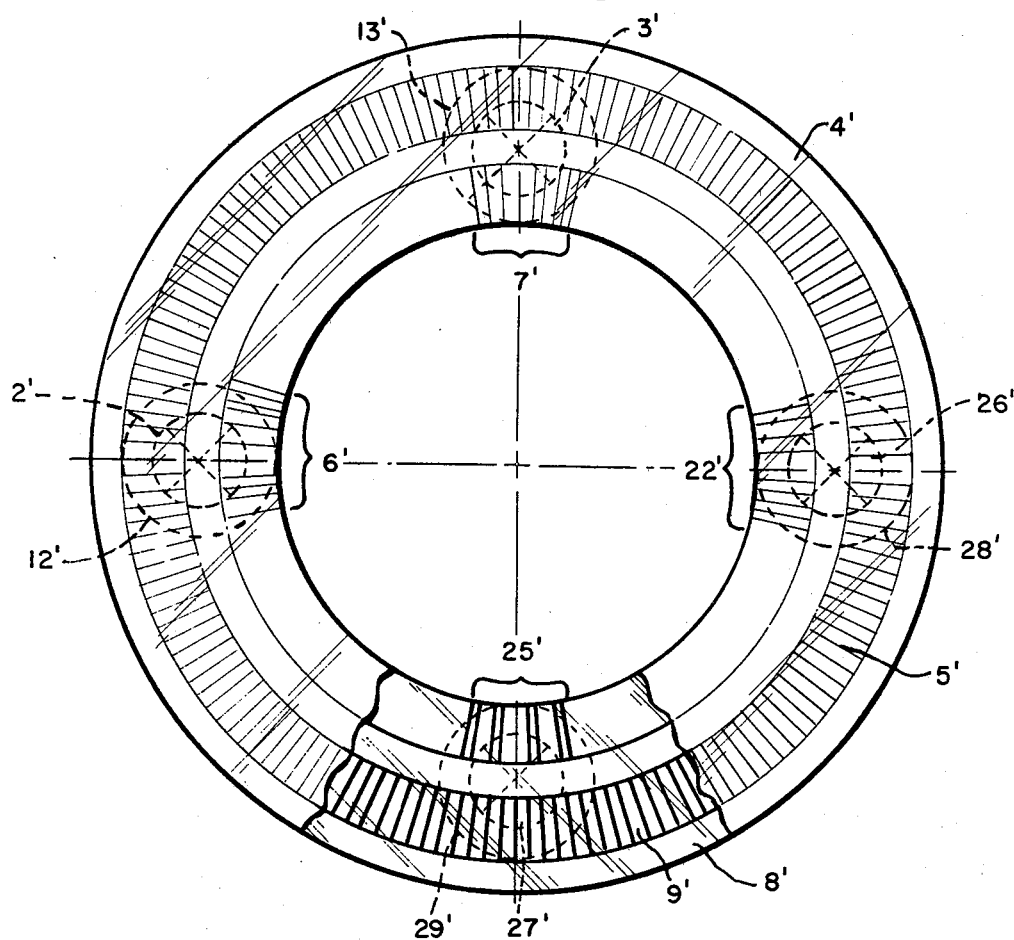
FIG. 5 is a schematic cut-away bottom view, taken along line 5—5 of FIG. 6, of a photoelectric angle-measuring apparatus including a second preferred embodiment of the present invention.

Referring to the drawings, FIGS. 1 and 2 show a photoelectric positioning apparatus including a first preferred embodiment of the present invention. The figures show a scanning unit 1 which is slidably borne relative to a scale 4. During operation, the scanning unit 1 guides a reticle 8 of the scanning unit 1 along the the scale 4 in a known manner.

Scale 4 carries, as shown in FIG. 3, a measuring grid 5 and a plurality of reference marks 6 and 7. Each reference mark 6,7 is comprised of a line group with a unique irregular line spacing pattern such that no two of the reference marks 6,7 are identical.

Reticle 8 of the scanning unit 1 carries, as shown in FIG. 4, a measuring grid 9 and reading fields 10 and 11. Each reading field 10,11 is comprised of a line group with an irregular line spacing pattern that corresponds with the line spacing pattern of a single one of the plurality of scale reference marks 6,7.

The scanning unit 1 contains two lamps 2 and 3. The lamps are secured to the scanning unit 1 at a given constant spacing from each other. The light which emanates from the lamps 2 and 3 is collimated by condensers 12 and 13, respectively and then passes through both the reticle 8 and the scale 4. The collimated light is modulated by the transparent and opaque fields of (1) the measuring grids 5 and 9; (2) the reference mark 6 and the reading field 10; and (3) the reference mark 7 and the reading field 11, in a known manner. The modulated light impinges upon photosensors 14, 15, 16, and 17. The photosensors produce scanning signals in response thereto.

As shown by FIGS. 1 and 2, photosensors 14 and 15 respond to light modulated by grids 5 and 9 while photosensors 16 and 17 respond to the light modulated by reference marks 6 and 7 and reading fields 10 and 11. The signals produced by the photosensors are processed by a processing unit 18 which controls an up-down counter 19 to display thereon the relative displacement.

The processing and control circuits of this embodiment will not be discussed in detail here, as forward or backward counting in response to leading or lagging signals is known to the art. The same holds true for the elimination of direct-current components that can affect signal symmetry. It will only be pointed out that for these purposes additional reading fields and photosensors can be provided for scanning the scale in a known manner, and which interact through known circuitry.

FIG. 3 shows the scale 4 carrying two line tracks, one of which comprises the measuring grid 5 having a given grid constant, and the other of which comprises the reference marks 6 and 7. The spacing of the parallel lines of a line group which comprises each reference mark is irregular. It is important that the spacing pattern within each line group be unambiguous. The spacing pattern of the line group comprising one reference mark is made nonidentical to, and preferably as dissimilar as possible from, the spacing patterns of line groups which comprise other reference marks.

FIG. 4 shows a reticle 8 which also carries two line tracks, one comprising the grid 9 and the other comprising the reading fields 10 and 11. The spacing pattern of a line group comprising a reading field is identical to the spacing pattern of the line group which comprises that reading field's corresponding reference mark. During operation when the reading field and the corresponding reference mark align, a reference pulse signal is produced in a known manner.

The two reference marks 6 and 7 and their corresponding reading fields 10 and 11 are arranged to align at the same time, so as to be in phase, so that upon alignment two reference pulse signals are produced. These signals are then analog added. This results in a composite reference pulse signal of greater magnitude than that of its constituent signals. It is in response to the composite signal that the processing unit 18 increments or decrements the up-down conter 19.

The grid 9 and reading fields 10 and 11 must lie offset from one another by a given spacing, because signals which are generated by the system are processed via analog addition. This yields a higher accuracy of measurement because a larger area of line tracks will have been scanned. Minor signal errors may result if the line grids are not perfectly clean.

Because each reading field has a line group spacing pattern identical with that of a single reference mark and different from the spacing patterns of all other reference marks, it is insured that only alignment of a reading field with its corresponding, and no other, reference mark generates a reference pulse signal of an adequately high signal-to-noise ratio. If the reticle is moved with respect to the scale so that a reading field is no longer aligned with its corresponding reference mark, no reference pulse signal is produced. Since a reference pulse signal is generated only at one position of the scale and reticle, the reference point so established is clear and unambiguous.

Figure 6:
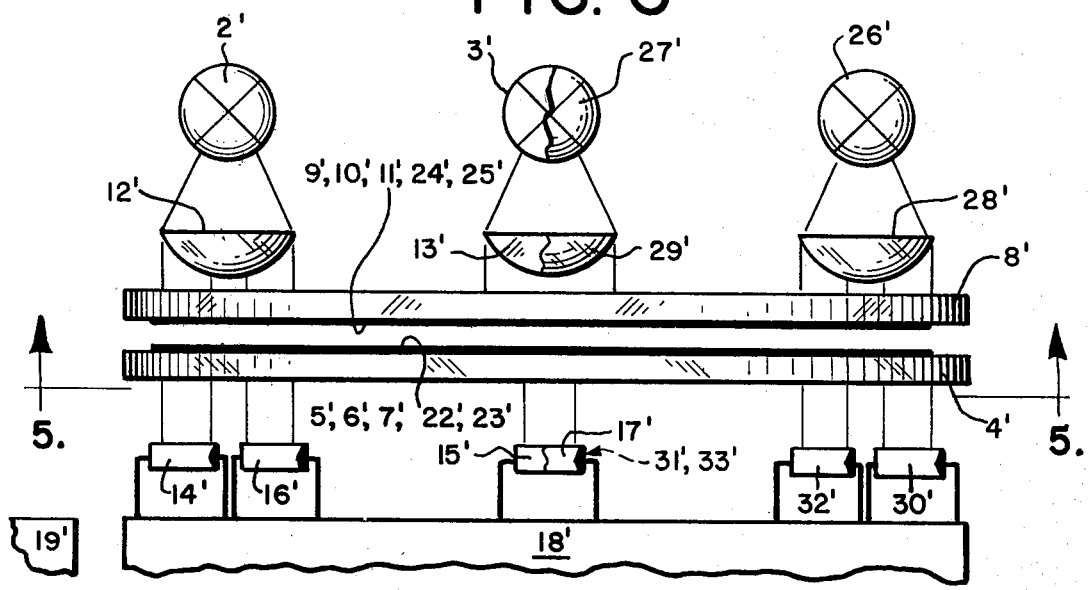
FIG. 6 is a schematic side view of the photoelectric angle-measuring apparatus of FIG. 5.

FIGS. 5 and 6 show an angle-measuring apparatus including a second preferred embodiment of the present invention. In these Figures the scale 4' is shown carrying a measuring grid 5' and four reference marks 6', 7' 22', and 23'. Reticle 8' is shown carrying a grid 9' and four reading fields 10', 11', 24', and 25'.

Each reference mark 6', 7', 22', and 23' is comprised of a line field having a unique irregular line spacing pattern. Each reading field 10', 11', 24', and 25' is also comprised of a line field having the irregular line spacing pattern of its corresponding reference mark. While all of the reference marks and reading fields are not represented in detail in these Figures, the scale 4' and reticle 8' correspond generally to the scale 4 and reticle 8 shown in FIGS. 1 through 4, and therefore an understanding of the invention is not impaired.

FIGS. 5 and 6 show that the four scanning positions within the scanning unit comprise lamps 2', 3', 26', and 27', condensers 12', 13', 28' and 29' and photosensors 14', 15', 16', 17', 30', 31', 32', and 33', respectively. The photosensors 14', 15', 30' and 31' serve to detect incremental intervals of an arc from the modulation produced by grids 5' and 9', while photosensors 16', 17', 32', and 33' serve to detect the reference position.

The four individual pulse signals generated by photosensors 14', 15', 30', and 31' are analog added in the processing unit 18' to form a composite pulse signal in response to which the up-down counter 19' is controlled.

In this apparatus, the precision of measurement is increased by the multiplicity of readings taken, as described above. Moreover, through a "diameter reading" the eccentricity error of the line fields is eliminated. A diameter reading system for optical angle-measuring systems is described in West German Pat. No. 24 54 915.

Since each of the reference marks 6', 7', 22', and 23' has a unique line spacing pattern, and each of the reading fields 10', 11', 24', and 25' has a line spacing pattern corresponding to that of its respective reference mark, a clear and unambiguous reference mark signal is generated when, and only when, the system reaches its reference position.

Should there be a partial interruption of illumination due to the loss of illumination from one of the two lamps 2 and 3 in FIG. 1 or 2, or from one or more of the lamps 2', 3', 26', and 27' in FIGS. 5 and 6, the composite reference pulse signal will continue to be generated at the reference position, though the reading field and reference mark associated with a failed lamp will no longer provide a reference pulse signal. In the worst case, the amplitude of the composite reference pulse signal will decrease. Through correct adjustment of a trigger threshold in the processing unit this disadvantage can become inconsequential. A further way to avoid this disadvantage lies in the circuitry diagrammed in FIG. 7.

FIG. 7 shows a circuit for the simultaneous operation of both lamps 2 and 3, shown in FIGS. 1 and 2, from a common power source 20. Connecting the lamps 2 and 3 in parallel and across a common resistor 21 in series with the power source 20, as shown in FIG. 7, results in the operation of the two lamps at a reduced voltage. This in turn results in a lower brightness of each lamp, which in turn results in a signal of lower magnitude at the output of each photosensor 14, 15, 16, and 17. Through the analog addition of signals from photosensors 14 and 15 and photosensors 16 and 17, respectively, there result composite signals whose levels are higher than that of the component signals. A trigger threshold in the processing unit 18 is adjusted according to the level of the composite signal.

Upon the failure of lamp 2 or 3, the voltage drop across resistor 21 is lowered, resulting in the operation of the remaining lamp at a higher voltage than previously. This increases the brightness of the remaining lamp, thereby increasing the illumination of the associated photosensors, which in turn results in an increase in the level of the output signal generated by those photosensors. Characteristic curves show that the signal so generated is approximately equal in level to the signal obtained by analog addition when both lamps are functioning. Therefore the trigger threshold does not have to be changed.

The processing unit circuitry may furthermore be made such that the drop-out of a lamp is reported by a signalling device.

The same or an analogous circuit may be utilized for the apparatus of FIGS. 5 and 6, where two or more lamps may be connected via such a circuit to one power source, and where more than one such circuit may be utilized.

Selection of the values of components comprising the apparatus lies within the skill of those familiar with the art, and therefore it will not be discussed here in detail.

Of course, it should be understood that various changes and modifications to the preferred embodiments described above will be apparent to those skilled in the art. For example, the invention is not restricted to photoelectric incremental measuring arrangements that operate in the cross-illumination mode, but it can be utilized in systems that operate in a direct-illumination mode. Furthermore, the invention is not restricted to two or four reference marks. Any desired number of reference marks and corresponding reading fields may be utilized. These and other changes and modifications can be made without departing from the spirit or scope of the present invention.

I claim:

1. In a photoelectric incremental measuring apparatus for measuring the relative displacement of two objects, the apparatus including a measuring scale and a scanning unit for scanning the scale having a reticle, the scale and reticle each carrying a measuring grid, the improvement comprising:

the scale having at least two nonidentical reference marks, each of which reference marks comprises a line group with an irregular line spacing pattern;

the reticle having at least two reading fields, each of which reading fields comprises a line group with an irregular line spacing pattern that is substantially identical to the line spacing pattern of a selected one of the reference marks, the reading fields positioned on the reticle such that each reading field aligns simultaneously with its corresponding reference mark at only one relative position between the scale and the scanning unit as the scanning unit moves relative to the scale;

the scanning unit having at least two reference mark reading positions, each reference mark reading position comprising a respective detection means for detecting the alignment of the respective reading field with its corresponding reference mark and for generating respective individual detection signals in response thereto; and means for combining the individual detection signals to generate a composite detection signal of higher accuracy than the individual detection signals.

2. The apparatus of claim 1 wherein the scale further comprises a line track containing the reference marks.

3. The apparatus of claim 1 or 2 wherein the scale has a radius of curvature centered about a selected axis of rotation.

4. The apparatus of claim 3 wherein each of the at least two reading positions comprises a respective light source, and wherein the invention further comprises means for connecting a common power source to the at least two light sources, the connecting means being responsive to the dropping out of fewer than all the light sources such that the brightness of the remaining light source is increased.

5. The apparatus of claim 4 wherein the connecting means comprises a resistor mounted commonly in series with the at least two light sources.

6. The apparatus of claim 3 wherein at least two reading positions are arranged diametrically.

7. The apparatus of claim 6 further comprising a means for signalling the dropping out of a light source.

8. The invention of claim 1 wherein each reading position comprises a separate, respective light source.

9. In a photoelectric incremental measuring apparatus for measuring the relative displacement of two objects, the apparatus including a measuring scale and a scanning unit for scanning the scale having a reticle, the scale and reticle each carrying a measuring grid, the improvement comprising:

the scale having at least two nonidentical reference marks, each of which reference marks comprises a respective line group with an irregular line spacing pattern;

the reticle having at least two reading fields, each of which reading fields comprises a respective line group with an irregular line spacing pattern that is substantially identical to the line spacing pattern of a selected one of the reference marks, the reading fields positioned on the reticle such that each reading field aligns with its corresponding reference mark simultaneously at only one relative position between the scale and the scanning unit as the scanning unit moves relative to the scale;

the scanning unit having at least two reference mark reading positions and at least two light sources such that each reference mark reading position has its own light source, each reference mark reading position comprising a respective detection means for detecting the alignment of the respective reading field with its corresponding reference mark; and means for connecting a common power source to the at least two light sources, the connecting means being responsive to the dropping out of fewer than all the light sources such that the brightness of the remaining light sources is increased.

10. The apparatus of claim 9 wherein the scale further comprises a line track containing the reference marks.

11. The apparatus of claim 9 or 10 wherein the scale has a radius of curvature centered about a selected axis of rotation.

12. The apparatus of claim 11 wherein the at least two reference mark reading positions are arranged diametrically with respect to the selected axis of rotation.

13. The apparatus of claim 8 wherein the connecting means comprises a resistor mounted commonly in series with the at least two light sources.

14. The apparatus of claim 8 further comprising means for signalling the dropping out of a light source.

15. In a photoelectric incremental measuring apparatus for measuring the relative displacement of two objects, the apparatus including a measuring scale and a scanning unit for scanning the scale, the scanning unit having a reticle, the scale and reticle each carrying a respective measuring grid, the improvement comprising:

at least two nonidentical reference marks on the scale, each of which reference marks comprises a line group with an irregular line spacing pattern;

a first and a second reading field on the reticle, each of which reading fields comprises a line group with an irregular line spacing pattern that is substantially identical to the line spacing pattern of a selected one of the reference marks, the reading fields positioned on the reticle such that each reading field aligns with its corresponding reference mark at only one relative position between the scale and the scanning unit as the scanning unit moves relative to the scale;

a first light source and a second light source included in the scanning unit;

a first pair of photosensitive elements including a first element responsive to light from the first light source modulated by the first reading field and the reference marks and a second element responsive to light from the first light source modulated by the measuring grid of the reticle and the measuring grid of the scale;

a second pair of photosensitive elements including a first element responsive to light from the second light source modulated by the second reading field and the reference marks and a second element responsive to light from the second light source modulated by the measuring grid of the reticle and the measuring grid of the scale;

the first element of the first pair of photosensitive elements generating a first reference pulse only upon alignment of the first reading field with its corresponding reference mark and the first element of the second pair of photosensitive elements generating a second reference pulse only upon alignment of the second reading field with its corresponding reference mark, the first and second reference pulses being generated simultaneously;

means for summing the first and second reference pulses to produce a composite reference pulse signal; and means for connecting a common power source to the first and the second light sources, the connecting means being responsive to the dropping out of one of the light sources such that the brightness of the remaining functioning light source is increased thereby increasing the illumination of the pair of photosensitive elements corresponding to the remaining functioning light source to increase the level of the reference pulse generating by the first element of the pair of photosensitive elements corresponding to the remaining functioning light source.

16. In a photoelectric incremental measuring apparatus for measuring the relative displacement of two objects, the apparatus including a measuring scale and a scanning unit for scanning the scale having a reticle, the scale and reticle each carrying a measuring grid, the improvement comprising:

the scale having at least two nonidentical reference marks, each of which reference marks comprises a line group with an irregular line spacing pattern;

the reticle having at least two reading fields, each of which reading fields comprises a line group with an irregular line spacing pattern that is substantially identical to the line spacing pattern of a selected one of the reference marks, the reading fields positioned on the reticle such that each reading field aligns with its corresponding reference mark at only one relative position between the scale and the scanning unit as the scanning unit moves relative to the scale;

the scanning unit having at least two reference mark reading positions and at least two light sources such that each reference mark reading position has its own light source, each reference mark reading position comprising a respective detection means for detecting the alignment of the respective reading field with its corresponding reference mark; and means for connecting a common power source to the at least two light sources, the connecting means being responsive to the dropping out of fewer than all the light sources such that the brightness of the remaining light sources is increased.

17. The invention of claim 16 wherein the connecting means comprises a resistor mounted commonly in series with the at least two light sources.

18. The invention of claim 16 further comprising means for signalling the dropping out of a light source.

19. The invention of claim 16 wherein the scale further comprises a line track containing the reference marks.

* * * * *

UNITED STATES PATENT AND TRADEMARK OFFICE
CERTIFICATE OF CORRECTION

PATENT NO. : 4,403,859
DATED : September 13, 1983
INVENTOR(S) : Alfons Ernst

It is certified that error appears in the above-identified patent and that said Letters Patent is hereby corrected as shown below:

<u>IN THE CLAIMS</u>

In claim 13 (column 7, line 7), please delete "8" and substitute therefore --9--;

In claim 14 (column 7, line 10), please delete "8" and substitute therefore --9--.

Signed and Sealed this

Fourteenth Day of August 1984

[SEAL]

Attest:

Attesting Officer

GERALD J. MOSSINGHOFF

*Commissioner of Patents and Trademarks*